(12) United States Patent
Holberg et al.

(10) Patent No.: US 6,285,536 B1
(45) Date of Patent: Sep. 4, 2001

(54) HIGH VOLTAGE INPUT PAD SYSTEM

(75) Inventors: Douglas R. Holberg, Wimberley; Nadi R. Itani; David R. Welland, both of Austin, all of TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 09/433,812

(22) Filed: Nov. 3, 1999

Related U.S. Application Data (63) Continuation of application No. 09/075,449, filed on May 8, 1998, now Pat. No. 6,038,116.

(51) Int. Cl.[7] ....................................... H02H 9/00
(52) U.S. Cl. ................................................ 361/56
(58) Field of Search .................... 330/250, 251, 330/279, 285, 287, 298, 116, 117, 207 P; 361/54, 56, 58, 111, 119

(56) References Cited

U.S. PATENT DOCUMENTS

| | | | |
|---|---|---|---|
| 4,605,980 | * | 8/1986 | Hartranft et al. ................. 361/56 |
| 4,930,036 | * | 5/1990 | Sitch ................................. 361/56 |
| 5,545,909 | * | 8/1996 | Williams et al. ................. 361/111 |
| 5,764,464 | * | 6/1998 | Botker et al. ..................... 361/56 |

* cited by examiner

*Primary Examiner*—Ronald W. Leja
(74) *Attorney, Agent, or Firm*—Robert P. Bell; Steven Lin (57) ABSTRACT

A high voltage input pad and method for accepting electrostatic discharge (ESD) surges without damage to an input semiconductor amplifier. The protection system includes a metal gate, transistor, and n-well resistors which provide ESD protection. Protection is further provided against large voltages coupled to an amplifier by connecting an input bipolar junction transistor to the negative input connection of the amplifier. Negative surges are directed to ground with an anode grounded diode connected at its cathode to the negative input connection of the amplifier.

19 Claims, 5 Drawing Sheets

HIGH VOLTAGE INPUT PAD SYSTEM

This application is a continuation application of U.S. patent application Ser. No. 09/075,449, filed May 8, 1998 entitled "High Voltage Input Pad System", now U.S. Pat. No. 6,038,116.

RELATED APPLICATIONS

This application is related to patent application Ser. Nos. 09/015,382, 09/075,491, 09/075,506, 09/075,446, and 09/075,348, respectively entitled "Image Processor Circuits, Systems, and Methods" having inventors Sandra Marie Johnson, Shih-Chung Chao, Nadi Rafik Itani, Caiyi Wang, Brannon Craig Harris, Ash Prabala, Douglas R. Holberg, Alan Hansford, Syed Khalid Azim, and David R. Welland; "Digital Camera Signal Processor and Method" having inventors Syed Khalid Azim, Shih-Chung Chao, Brannon Craig Harris, and Ash Prabala; "Pipelined Analog-to-Digital Converter (ADC) Systems, Methods, and Computer Program Products" having inventors Sandra Marie Johnson and David R. Welland; "Histogram-Based Automatic Gain Control Method and System for Video Applications" having inventors Nadi Rafik Itani, Caiyi Wang, and David R. Welland, and "Selectable Threshold Multimode Gain Control Apparatus and Method for Setting Mutually Continuous Analog, Digital, and Shutter Gain Levels" having inventors Nadi Rafik Itani, Caiyi Wang, and David R. Welland; each of these applications filed on May 8, 1998 and incorporated herein by reference in their entirety.

BACKGROUND OF THE INVENTION

1. Field of the Invention

The present invention relates to high voltage input pad systems and methods and more particularly to electrostatic discharge protection for high voltage input pads.

2. Description of Related Art

The technical problems of interfacing semiconductor chips which operate with a 5 volt power supply with charge coupled devices (CCDs) have been inadequately addressed in the related art. In particular, the related art requires CCDs to operate from a 15 volt supply and to have an output signal with an offset of approximately 12 volts. Such systems with a standard ESD pad do not allow input voltages this large, because the input voltage range is limited to the value of the power supply range plus the voltage of two diode drops. In order to interface to an analog front end semiconductor chip which operates with a 5 volt power supply, the input CCD signal is AC-coupled through an external capacitor in order to reduce the input signal to a predetermined offset level. In one electrostatically discharge protected pad arrangement of the related art, the input signal pad is connected through resistor to an input amplifier. The resistor of this pad arrangement is in turn coupled to the connecting nodes of two pairs of first and second series-connected diodes which are coupled between ground potential and VDD. This circuit causes electrostatic discharge surges to be discharged through the first and second series-connected diodes either to ground or VDD. Thus, the voltage at a gate is prevented from getting much higher than VDD or much lower than ground. As a result, the voltage level of the gate outside of the semiconductor chip remains limited and prevents the chip from fusing and shorting to ground. This approach offers a certain level of electrostatic discharge protection in particular situations. The operating range of such input circuitry is, however, limited to a one diode drop below ground and one diode drop above VDD. This is an unacceptable input operating voltage range for many electric circuits without using an external AC coupling capacitor and systems which require ESD protection.

SUMMARY OF THE INVENTION

According to one embodiment of the present invention, a circuit for protecting against the effects of electrostatic discharge includes a metal gate transistor (MGT) having a metal gate, a source connected to ground, and a drain; and first and second n-well resistors respectively connected to an input connection and an output connection for the circuit. With the pad ESD protection, voltage swings larger than the 5V supply can still couple to the amplifier through the internal AC coupling capacitor. This problem is solved as follows:

According to one embodiment of the present invention, an amplifier is protected from electrostatic discharge surges by connection of an anode grounded diode with its cathode connected to the input of the amplifier to handle negative surges, and in parallel therewith a bipolar junction transistor for diverting positive electrostatic surges to ground. According to one embodiment of the present invention, the base of the bipolar junction transistor is connected to the gate and drain of the higher potential one of a pair of series connected MOSFET transistors. According to one embodiment of the present invention, the lower potential one of the series connected MOSFET transistors is connected at its gate and drain to the source of the higher potential transistor and to the positive input connection of the amplifier. The protection circuitry according to the present invention thus protects camera semiconductor chips operating with a low voltage power supply from the detrimental effects of electrostatic discharge.

DETAILED DESCRIPTION OF A PREFERRED MODE

Figure 1A:
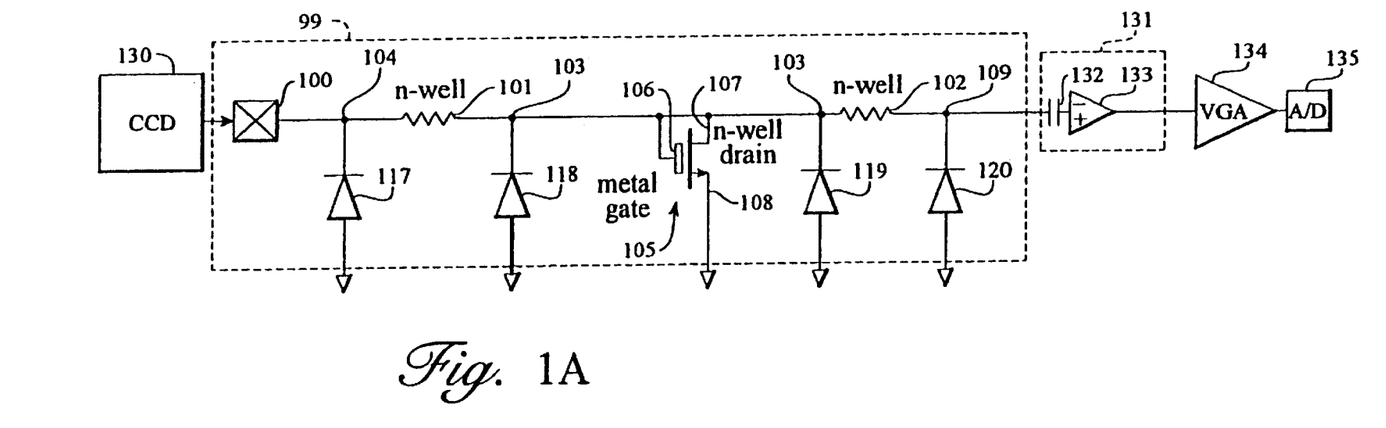
FIG. 1A is a circuit diagram of an electrostatic discharge pad system according to one embodiment of the present invention.

Referring now to FIG. 1A, there is shown a circuit diagram of an electrostatic discharge pad system (EDPS) 99, which has a large input voltage range. EDPS 99 includes an input pad 100 for receiving electric signals from a selected device such as, for example charge coupled device (CCD) 130. There is no off-chip prior art DC blocking capacitor between input pad 100 and CCD 130. Such an off-chip DC blocking capacitor of the prior art increases overall system costs. According to the prior art, the anode of a diode to 5 volts is connected to pad 100. A typical input voltage to pad 100 is 15 volts which would. affirmatively turn on the diode to 5 volts without a DC blocking capacitor.

The EDPS 99 further includes first and second n-well resistors, respectively 101 and 102, which are connected in series to each other at a common node 103 between pad 100 and an input gain stage 131. EDPS 99 additionally includes a metal gate transistor 105 and first through fourth diodes connected at their anodes to ground, respectively 117 through 120. First through fourth diodes 117–120 are fabricated with an n-well and a p-substrate.

The metal gate transistor 105 includes a metal gate 106, an n-well drain 107, and a source 108 connected to ground. Metal gate transistor 105 includes a thick layer of oxide between the gate and the channel. The metal region of the metal gate transistor 105 sets up an electric field large enough to cause an inversion resulting in majority carrier current flow. Metal gate transistor 105 includes a plurality (e.g., on the order of 100 transistor devices) of thick field metal gate transistor devices in parallel to improve performance. The cathode of diode 117 is connected at node 104 between pad 100 and first n-well transistor 101. The cathode of second diode 118 is connected between first n-well resistor 101 and the gate and drain of metal gate transistor 105 at node 103. The cathode of third diode 119 is connected between the gate and drain of metal gate transistor 105 and second n-well resistor 102 at node 103. The cathode of the fourth diode 120 is connected to the output connection of second n-well resistor 102 leading to an input gain stage 131 at node 109.

Input gain stage 131 may includes a reduced size DC coupling capacitor (RSDCC) 132 and an amplifier 133, which in turn is connected to VGA 134 and analog-to-digital converter (ADC) 135. According to one embodiment of the present invention, RSDCC 132 is fabricated upon the same semiconductor chip as EDPS 99, to reduce costs and improve reliability. EDPS 99 according to the present invention permits receipt of large input voltage range voltage signals at input pad 100, while still providing substantial electrostatic discharge protection.

EDPS 99 contains no diodes connected to VDD. Accordingly, the upper range of the input voltage is a function of the breakdown voltage of the diodes to ground (i.e., diodes 117–120) and the threshold voltage of the metal gate transistor 105. For example, the upper range is limited by the breakdown voltage. Moreover, the signal path of EDPS 99 contains no n-plus contacts outside of n-wells. In particular, each of diodes 117–120 may formed with n-well to substrate junctions. The breakdown voltage according to one embodiment of input pad 100 is approximately 22 volts.

The use of a metal gate transistor 105 provides enhanced protection. An n-well drain is used for metal gate transistor 105 to facilitate operation. A metal gate 106 is fabricated for metal gate transistor 105 at a first metallization layer of the semiconductor structure. By using the first metallization layer rather than poly as a gate according to the present invention, the oxide between the metal gate transistor channel and the metal gate 106 is of enhanced thickness. This enhanced thickness of the oxide in the channel has the effect of increasing the threshold voltage of metal gate transistor 105. The threshold voltage of metal gate transistor 105 is approximately 25 volts. Accordingly, substantial protection is provided against electrostatic discharge hits. Furthermore, an input voltage range between approximately −0.7 volts and approximately 22 volts is provided. The output of input gain stage 131 is connected in turn to a VGA 134 and an analog-to-digital converter 135.

Figure 1B:
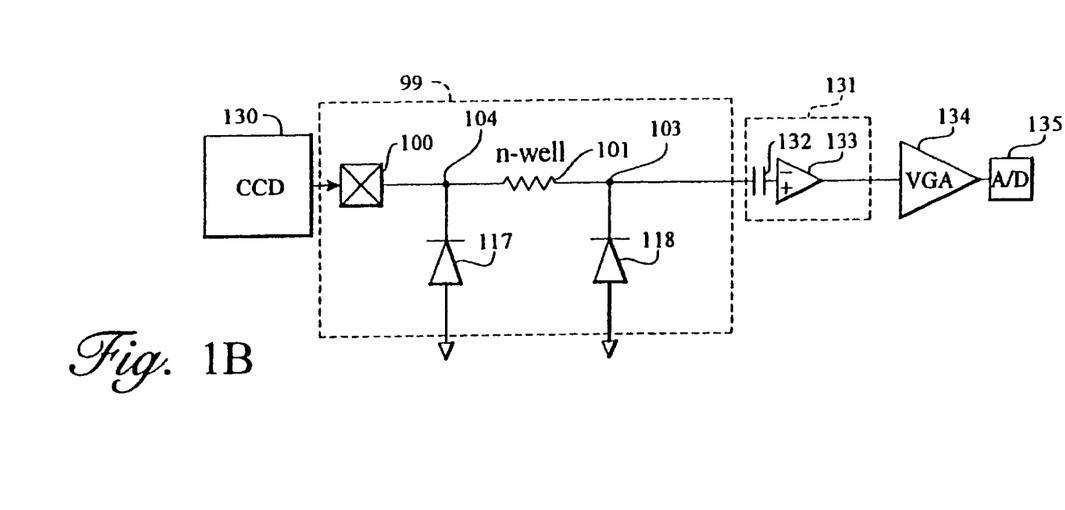
FIG. 1B is a circuit diagram of an electrostatic discharge pad system according to another embodiment of the present invention.

FIG. 1B is a circuit diagram of an electrostatic discharge pad system according to another embodiment of the present invention. In particular, EDPS 99 includes an input pad 100 for receiving electric signals from a selected device such as for example a charge coupled device (CCD) 130. There is no off-chip prior art DC blocking capacitor between input pad 100 and CCD 130. Such an off-chip DC blocking capacitor of the prior art increases overall system costs. According to the prior art, the anode of a diode to 5 volts is connected to pad 100. A typical input voltage to pad 100 is 15 volts which would affirmatively turn on the diode to 5 volts without a DC blocking capacitor. EDPS 99 further includes first and second n-well resistors, respectively 101 and 102, which are connected in series to each other at a common node 103 between the pad 100 and an input gain stage. EDPS 99 additionally includes first and second diodes 117 and 118 both connected at their anodes to ground, First and second diodes 117 and 118 are fabricated with an n-well and a p-substrate. The cathodes of respective diodes 117 and 118 are connected to opposite sides of the n-well resistor 101. Input gain stage 131 includes a reduced size DC coupling capacitor (RSDCC) 132 and an amplifier 133, which in turn is connected to VGA 134 and analog-to-digital converter (ADC) 135. RSDCC 132 is fabricated upon the same semiconductor chip as EDPS 99, to reduce costs and improve reliability. EDPS 99 according to the present invention permits receipt of large input voltage range voltage signals at input pad 100, while still providing substantial electrostatic discharge protection. EDPS 99 contains no diodes connected to VDD. Accordingly, the upper range of the input voltage is a function of the breakdown voltage of the diodes to ground (i.e., diodes 117–120). EDPS 99 includes a pad 100 and first and second n-well resistors connected to each other at a common node, and a diode connected at its anode to ground and at its cathode to the common node. In general, a distributed series resistance having distributed diodes anode connected to ground, comprises EDPS 99.

Figure 2:
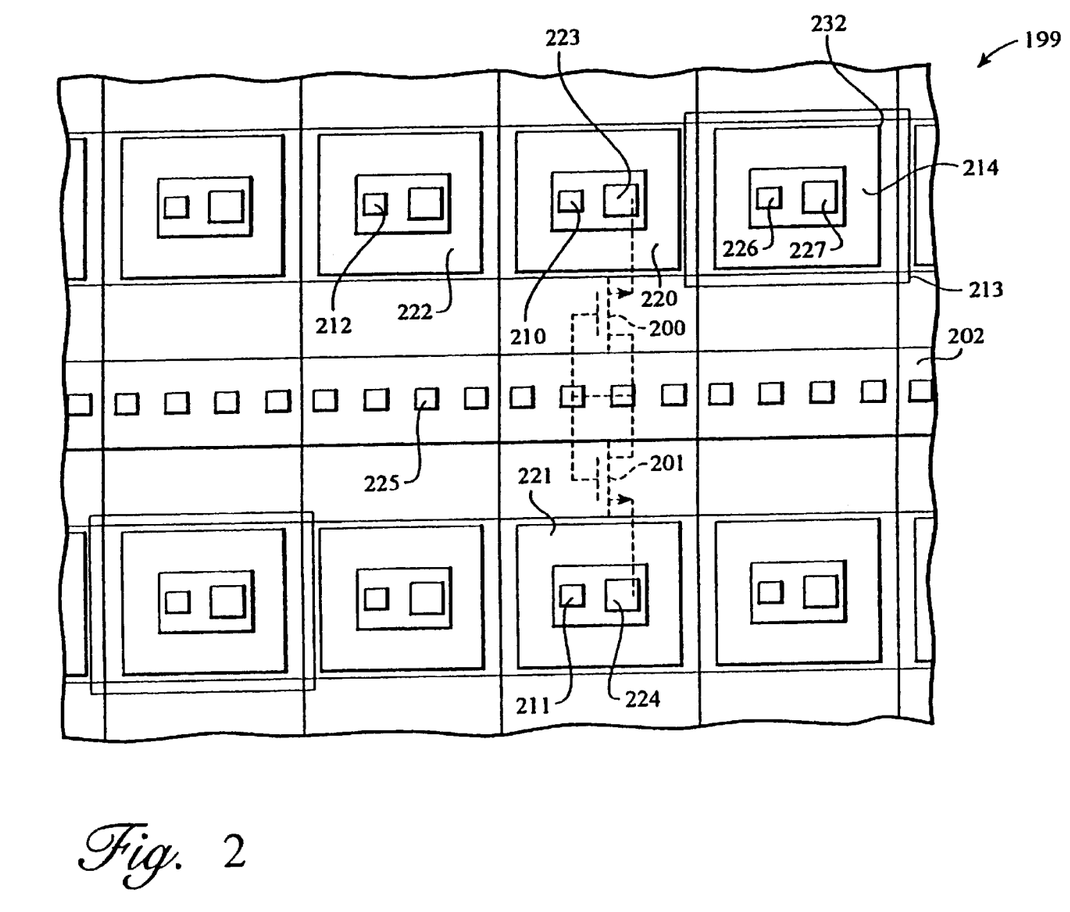
FIG. 2 is a diagram of the layout of a metal gate transistor according to the present invention.

Referring now to FIG. 2 there is shown a diagram of the layout of a metal gate transistor structure according to the present invention. In particular, FIG. 2 shows a semiconductor arrangement 199 including first and second metal gate transistors 200 and 201 and an n-well 202 connecting the first and second transistors 200, 201. Semiconductor arrangement 199 particularly includes a region where a lightly-doped n-type diffusion is implanted and driven into the p-substrate to create n-well 202. A heavier-doped diffusion is implanted within the region of the n-well 202 and is driven in to form a region in which a metal-silicon ohmic contact can be made. This forms the drain of the metal gate transistor 200. The semiconductor arrangement 199 also includes an additional heavily doped diffusion of n-plus type material within the p-substrate and in close proximity to the aforementioned n-well, to which a metal-silicon ohmic contact is fabricated. The semiconductor arrangement 199 also includes a first layer of metal (metal 1) which is in ohmic contact (at contact 225) with the heavier doped n-type diffusion material lying within the lighter doped n-well. This first layer of metal covers the region between the n-well and the n-plus diffusion, so that with sufficient potential difference between this first layer of metal and the p-substrate, an inversion region is formed so that majority carriers flow between these two regions in proximity to one another. The semiconductor arrangement 199 also includes contacts 210 and 211 which connect a first layer metal to the n-plus diffusion lying within the p-substrate. This first layer of metal provides an intermediate connection to which vias 223 and 224 further connect this first layer of metal to a second layer of metal (metal 2) which is connected to ground. The semiconductor arrangement 199 also includes a connection of the p-substrate to ground with a substrate tie 213. Substrate tie 213 includes a p-plus diffusion 214 which is connected to a first layer of metal (metal 1) with contact 226 providing an intermediate connection to which via 227 further connects this first layer of metal to a second layer of metal (metal 2) which is connected to ground, thereby providing a means to tie the substrate to ground These substrate ties are interspersed appropriately so that no substrate tie is separated from another by more than about 75 micrometers according to one embodiment of the present invention.

Figure 3:
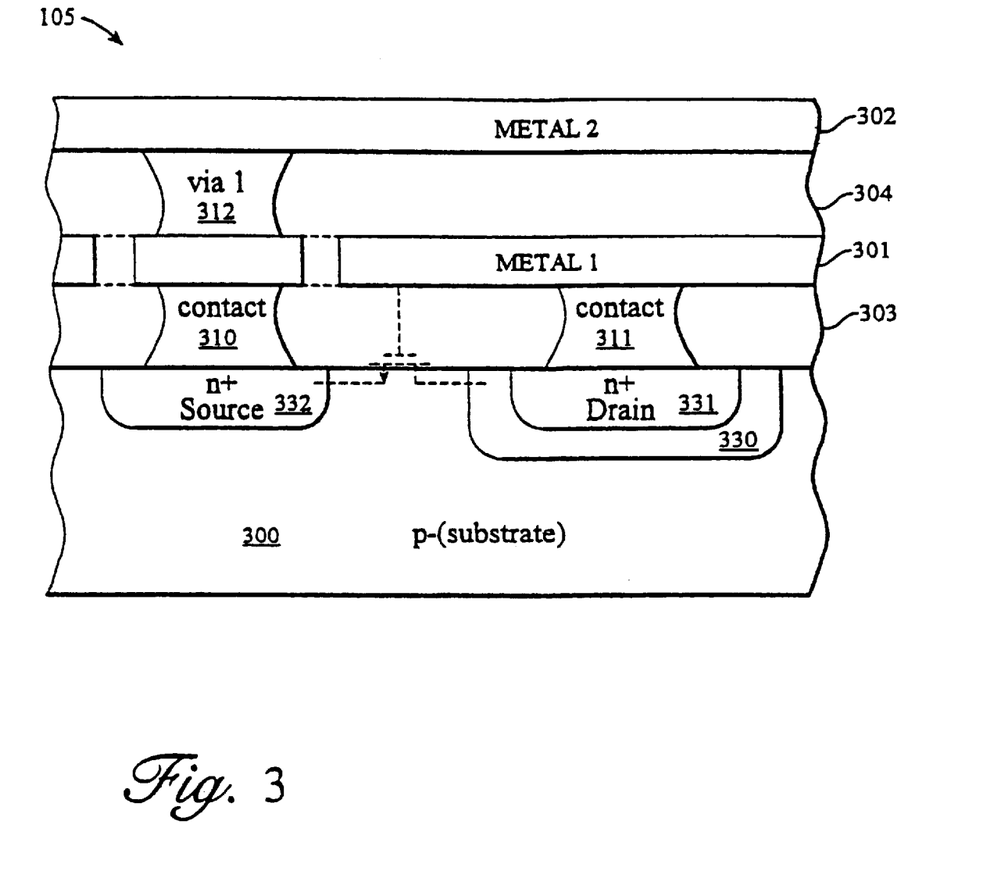
FIG. 3 is a cross-sectional diagram of a portion of a metal gate transistor according to the present invention.

Referring now to FIG. 3, there is shown a cross-sectional diagram of a metal gate transistor 105 according to the present invention. In particular, metal gate transistor 105 is fabricated in a semiconductor arrangement including a p-substrate 300, a first metallization layer 301, a second metallization layer 302, and first and second insulating layers 303 and 304. The p-substrate 300 is provided with an n-well drain 330 and an n-plus drain diffusion region 331 in the n-well drain 330. The p-substrate 300 is additionally provided with a diffused n-plus source region 332. Insulative region 303 includes first and second contacts 310 and 311. Insulative layer 304 includes a via 312. Contact 310 connects an isolated region of first metallization layer 301 to n-plus source region 332 and second metallization layer 302 through via 312. First metallization layer 301 serves as the gate for the metal gate transistor 105. A phantom representation of metal gate transistor 105 is shown in dashed format including respective gate, source, and drain connections.

Figure 4:
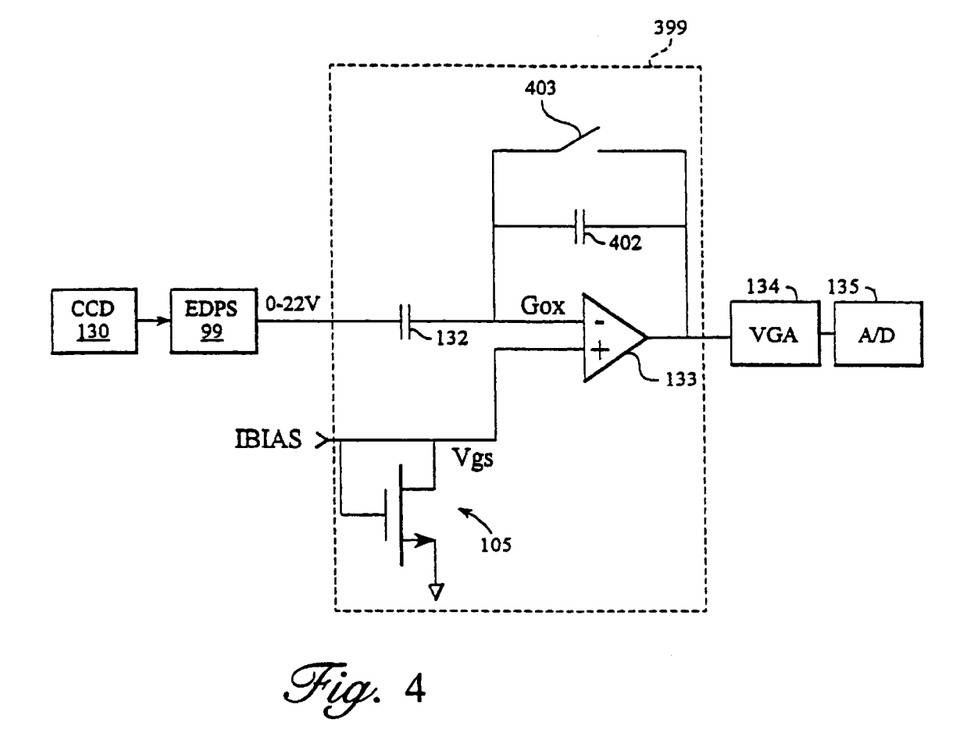
FIG. 4 is a diagram of an amplifier circuit that interfaces to the pad according to the present invention, which is used to step down and couple large input voltages to an acceptably workable operating level.

Referring now to FIG. 4, there is shown a diagram of an amplifier stage connected in a circuit 399 according to the present invention, which is used to couple large input voltages received from EDPS 99, down to a workable operating level. EDPS 99 receives analog signals from CCD 130. Voltage signals are received by circuit 399 which includes an amplifier 133 having positive and negative input terminals; a transistor 105 having connected gate and drain coupled to the positive input terminal of amplifier 133; and an input metal capacitor 132 connected to the negative input terminal of amplifier 133. Circuit 399 further includes a feedback capacitor 402 connecting the output of amplifier 133 to its negative input terminal which has gate oxide subject to damage by excessive input voltage swings. Circuit 399 further includes a feedback switch 403 in parallel with feedback capacitor 402 for selectively shorting out capacitor 402. The input positive terminal of amplifier 133 is connected to the gate and drain of transistor 105. According to one embodiment of the present invention, limited swings of input signal voltage can be accepted by circuit 399. During normal operation according to one embodiment of the present invention, an input signal is AC-coupled, which brings its voltage level to an acceptable range so that the input of the amplifier 133 does not receive a voltage which could damage the gate oxide of the amplifier 133. When an electrostatic discharge is encouraged causing an approximately 22 volt swing on the input side of input metal capacitor 132 and is coupled to the negative input side of amplifier 133, the gate oxide in amplifier 133 will fuse. The circuit shown in FIG. 5 is used to prevent such a voltage swing from affecting amplifier 133 detrimentally.

Figure 5:
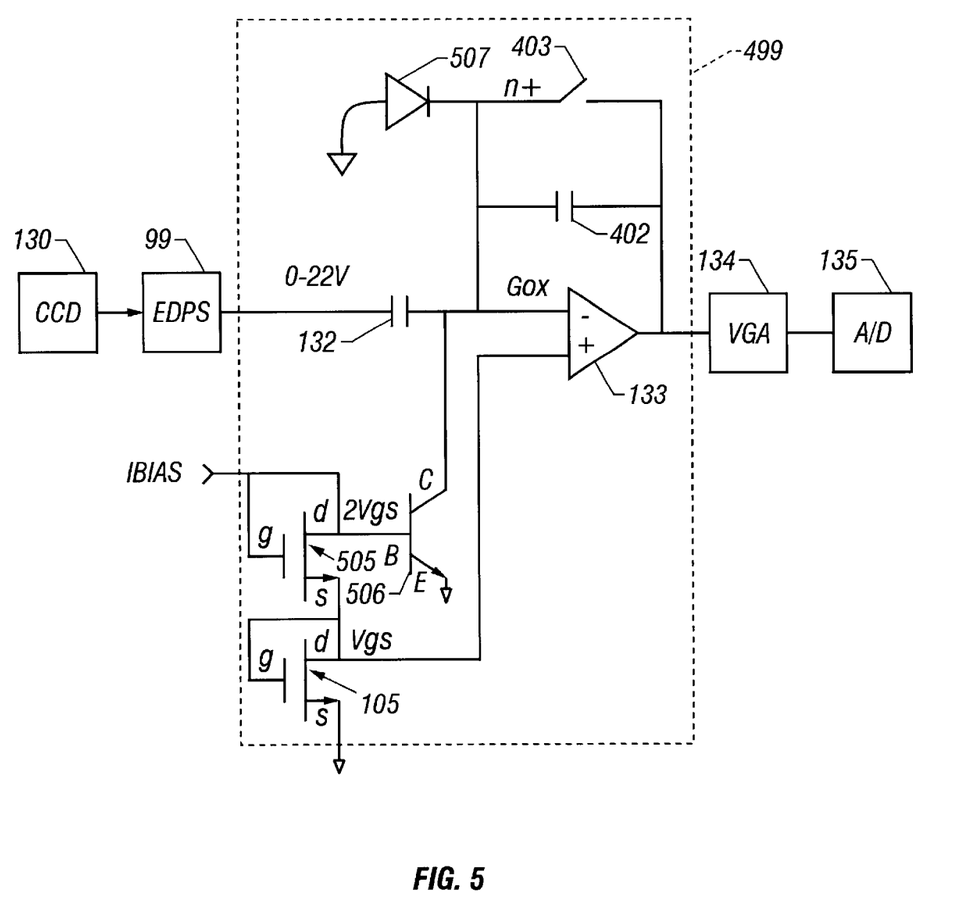
FIG. 5 is a diagram of an amplifier circuit that interfaces to the pad according to another embodiment of the present invention, which is used to couple large voltages and to protect against voltage spikes during electrostatic discharge events.

Referring now to FIG. 5, there is shown a diagram of a circuit 499 according to another embodiment of the present invention, which is used to couple large input voltages received from EDPS 99, and to protect against large voltage spikes experienced during electrostatic discharge hits. EDPS 99 receives analog signals from CCD 130. In particular, circuit 499 includes an amplifier 133 having positive and negative input terminals; a transistor 105 having a gate and drain connected to the positive input terminal of amplifier 400; an input metal capacitor 132 connecting the output of the EDPS 99 and the negative input terminal of the amplifier. Circuit 499 further includes a feedback capacitor 402 connecting the output of amplifier 133 to its negative input terminal and a feedback switch 403 in parallel with feedback capacitor 402 for selectively shorting out capacitor 402. Circuit 499 further includes a second transistor 505 in series with first transistor 105 again with gate and drain coupled, effectively transforming transistors 105 and 505 into series connected MOS diodes.

Circuit 499 further includes a bipolar junction transistor 506 and an anode grounded diode 507, each of them connected to the negative input terminal of amplifier 133. Further, IBIAS is connected to the base of bipolar junction transistor 506. The negative connection of amplifier 133 is held to less than approximately 10 to 12 volts by the circuitry shown in FIG. 5 to prevent the gate oxide from fusing.

During normal operation, the base of bipolar junction transistor 506 does not turn on. However, if there is a positive electrostatic discharge hit, the charge is dissipated through bipolar junction transistor 506. If there is a negative electrostatic discharge hit, the charge is dissipated through the diode formed by NMOS feedback switch 507. Accordingly, amplifier 133 is protected against damaging voltage spikes. The input positive terminal is additionally connected to the gate and drain of transistor 105. Up to approximately a 22 volt spike can be accepted at the input of circuit 499 without any detrimental effects. Input signals are AC-coupled with metal capacitor 132 for operation under normal conditions with a relatively small input signal swing. When an electrostatic discharge hits, up to approximately 22 volt swings on the input side of capacitor 132 are harmlessly discharged before reaching amplifier 133.

What is claimed is:

1. A circuit for protecting against electrostatic discharge while allowing high input analog voltage during normal operation, said circuit comprising:
   a first circuit portion including:
      a first diode having an anode and a cathode, said anode being coupled to a ground,
      a first n-well resistor having one end coupled to an input for said first circuit portion and another end coupled to the cathode of said first diode,
      a second n-well resistor having one end coupled to an output for said first circuit portion and another end coupled to the cathode of said diode, and
      a metal gate transistor (MGT) having a metal gate, a source coupled to ground, and a drain, the metal gate, and the drain being coupled to the cathode of said diode; and
   a second circuit portion, having an input coupled to the output of the first circuit portion, said second circuit portion including:
      a first diode having an anode coupled to around and a cathode coupled to the input of the second circuit portion, for shunting negative electrostatic discharge voltages,
      a bipolar function transistor, having a collector coupled to the input of the second circuit portion and an emitter coupled to ground, for shunting Positive electrostatic discharge voltages, a first transistor including source, drain, and gate, said drain and gate being coupled to each other, to the base of the bipolar junction transistor and to a second input of the second circuit portion, and a second transistor connected in series with said first transistor, said second transistor including source, drain and gate, and said gate and drain of said second transistor being coupled to each other, and the source of said first transistor being coupled to the drain of said second transistor.

2. The circuit according to claim 1, wherein the first circuit portion further comprises:

a second diode having an anode and a cathode, the anode of said second diode coupled to ground and the cathode of said second diode coupled to said first resistor.

3. The circuit according to claim 1, wherein the first circuit portion further comprises:

a second diode having an anode and a cathode, the anode of said second diode coupled to ground and the cathode of said second diode coupled to said second resistor.

4. The circuit according to claim 1, wherein said first resistor is coupled to an input pad.

5. A circuit for protecting against electrostatic discharge while allowing high input analog voltage during normal operation, said circuit comprising:

a first circuit portion including:
an n-well resistor having first and second resistor connections, said first resistor connection being coupled to an input of the first circuit portion and said second resistor connection being coupled to an output of the first circuit portion, a first diode having an anode and a cathode, the anode coupled to ground and the cathode coupled to said first resistor connection, and a second diode having an anode and a cathode, said anode coupled to ground and the cathode coupled to said second resistor connection; and a second circuit portion, having an input coupled to the output of the first circuit portion, said second circuit portion including:

a first diode having an anode coupled to ground and a cathode coupled to the input of the second circuit portion, for shunting negative electrostatic discharge voltages, a bipolar junction transistor, having a collector coupled to the input of the second circuit portion and an emitter coupled to ground, for shunting positive electrostatic discharge voltages, a first transistor including source, drain, and gate, and said drain and gate being coupled to each other, to the base of the bipolar junction transistor and to a second input of the second circuit portion, and a second transistor connected in series with said first transistor, said second transistor including source, drain and gate, and said gate and drain of said second transistor being coupled to each other, and the source of said first transistor being coupled to the drain of said second transistor.

6. A circuit for protecting against electrostatic discharge while allowing high input analog voltage during normal operation, said circuit comprising:

a first circuit portion including:
a metal gate transistor (MGT) having a metal gate, a source coupled to ground, and a drain, a first resistor having one end coupled to an input connection for said first circuit portion and another end coupled to the drain and gate of the MGT, and a second resistor having one end coupled to an output connection for said first circuit portion and another end coupled to a cathode of a first diode; and a second circuit portion, having an input coupled to the output of the first circuit portion, said second circuit portion including:

a first diode having an anode coupled to ground and a cathode coupled to the input of the second circuit portion, for shunting negative electrostatic discharge voltages, a bipolar junction transistor, having a collector coupled to the input of the second circuit portion and an emitter coupled to ground, for shunting positive electrostatic discharge voltages, and a second transistor including source, drain, and gate, said gate and drain of said second transistor being coupled to each other and to the base of the bipolar junction transistor, the source of the second transistor being coupled to ground.

7. The circuit according to claim 6, wherein the first circuit portion further comprises:

a second diode having an anode and a cathode, the anode of said second diode coupled to ground and the cathode of said second diode coupled to the gate of the MGT; and a third diode having an anode and a cathode, the anode of said third diode coupled to ground and the cathode of said third diode coupled to the gate of the MGT.

8. An electrostatic discharge protection circuit (EDPC) including:

a first circuit portion including:
a resistor coupled to an input pad,
a first distributed diode having a cathode coupled to the resistor and having an anode coupled to ground and
a metal gate transistor (MGT) having a drain and a gate, both the drain and gate coupled to the cathode of said first distributed diode; and a second circuit portion, having an input coupled to an output of the first circuit portion, said second circuit portion including:

a capacitor coupled to said drain of said MGT and connectable to an external circuit to be protected;

a first diode having an anode coupled to around and a cathode coupled to the capacitor, for shunting negative electrostatic discharge voltages, a bipolar junction transistor, having a collector coupled to the capacitor and an emitter coupled to ground, for shunting positive electrostatic discharge voltages, a second transistor including source, drain, and gate, said gate and drain of said second transistor being coupled to each other and to the base of the bipolar junction transistor, the source of the second transistor being coupled to ground.

9. The EDPC circuit of claim 8 wherein said MGT comprises a plurality of metal gate transistors connected in parallel.

10. The EDPC circuit of claim 8 wherein said first circuit portion further comprises:

a second distributed diode having an anode and a cathode, said anode of said second distributed diode coupled to ground.

11. The EDPC circuit of claim 10, wherein the cathode of said second distributed diode is coupled to said capacitor.

12. The EDPC circuit of claim 8, wherein said capacitor is a metal capacitor.

13. A protection circuit including:
a first circuit portion including:
an input pad connected to a source of analog signals;
a first distributed n-well resistance coupled to said input pad;
a metal gate transistor (MGT) having a gate and a drain coupled to said resistance at a portion spaced apart from said input pad; and
a second circuit portion, having an input coupled to an output of the first circuit portion, said second circuit portion including:
a first diode having an anode coupled to ground and a cathode coupled to the input of the second circuit portion, for shunting negative electrostatic discharge voltages,
a bipolar junction transistor, having a collector coupled to the input of the second circuit portion and an emitter coupled to ground, for shunting positive electrostatic discharge voltages,
a second transistor including source, drain, and gate, said gate and drain of said second transistor being coupled to each other and to the base of the bipolar junction transistor, the source of the second transistor being coupled to ground.

14. The protection circuit of claim 13, wherein said first circuit portion further comprises:
a distributed diode having an anode and a cathode, the anode of said distributed diode being coupled to ground and the cathode of said distributed diode coupled to said first distributed n-well resistance.

15. The protection circuit of claim 14, wherein said first circuit portion further comprises:
a second distributed n-well resistance coupled to said MGT.

16. The protection circuit of claim 15, wherein said distributed diode is coupled to said second distributed n-well resistance.

17. The protection circuit of claim 13, wherein said second circuit portion further comprises:
a capacitor coupled in series with said first distributed n-well resistance.

18. A charge coupled device (CCD) system, comprising:
a CCD device for providing an analog voltage output signal;
a first protection circuit portion comprising:
a pad,
a resistor having a first terminal coupled to said pad, and
a metal gate transistor (MGT) having a drain and a gate, both coupled to a second terminal of said resistor;
a second protection circuit portion, having an input coupled to an output of the first protection circuit portion, said second protection circuit portion including:
a capacitor coupled to said first protection circuit portion, and
an amplifier coupled to said capacitor for amplifying signals provided to said capacitor; and
signal processing circuitry coupled to said amplifier for processing signals amplified by said amplifier;
wherein said second protection circuit portion further includes:
a first diode having an anode coupled to ground and a cathode coupled to the input of the second circuit portion, for shunting negative electrostatic discharge voltages,
a bipolar junction transistor, having a collector coupled to the input of the second circuit portion and an emitter coupled to ground, for shunting positive electrostatic discharge voltages, and
a second transistor including source, drain, and gate, said gate and drain of said second transistor being coupled to each other and to the base of said bipolar junction transistor, the source of the second transistor being coupled to ground.

19. A circuit for protecting against electrostatic discharge while allowing high input analog voltage during normal operation, the circuit having first and second inputs, said circuit comprising:
a first transistor having a gate, a drain, and a source, the gate and drain of the first transistor coupled to the second input of the circuit;
a second transistor having a gate, a drain, and a source, the gate and drain of the second transistor coupled to the source of the first transistor and the source of the second transistor coupled to ground;
a bipolar junction transistor having a base, a collector, and an emitter, the base of the bipolar junction transistor coupled to the drain for the first transistor, the emitter of the bipolar junction transistor coupled to ground and the collector of the bipolar junction transistor coupled to the first input.

* * * * *